United States Patent [19]
Sichanugrist et al.

[11] Patent Number: 5,507,881
[45] Date of Patent: Apr. 16, 1996

[54] THIN-FILM SOLAR CELL AND METHOD OF MANUFACTURING SAME

[75] Inventors: Porponth Sichanugrist, Bangkok, Thailand; Shinji Fujikake; Hiromitsu Ota, both of Kanagawa, Japan

[73] Assignee: Fuji Electric Co., Ltd., Kawasaki, Japan

[21] Appl. No.: 213,717

[22] Filed: Mar. 16, 1994

Related U.S. Application Data

[63] Continuation-in-part of Ser. No. 77,824, Jun. 15, 1993, abandoned, which is a continuation-in-part of Ser. No. 953,522, Sep. 29, 1992, abandoned.

[30] Foreign Application Priority Data

| | | | |
|---|---|---|---|
| Sep. 30, 1991 | [JP] | Japan | 3-249936 |
| Apr. 14, 1992 | [JP] | Japan | 4-93191 |
| Jun. 17, 1992 | [JP] | Japan | 4-157092 |
| Mar. 16, 1993 | [JP] | Japan | 5-054433 |

[51] Int. Cl.$^6$ ............ H01L 31/075; H01L 31/20
[52] U.S. Cl. ............ 136/258; 257/53; 257/55; 257/431; 257/458; 427/579; 437/4; 437/101; 437/113
[58] Field of Search ............ 136/258 AM; 437/4, 437/100, 101, 113; 257/53, 55, 431, 458; 427/579

[56] References Cited

U.S. PATENT DOCUMENTS

5,140,397  8/1992  Haga et al. ................ 257/53
5,391,410  2/1995  Nii et al. ................ 427/578

FOREIGN PATENT DOCUMENTS

5-95126   4/1993  Japan ............ 136/249 TJ
5-259492 10/1993  Japan ............ 136/249 TJ

*Primary Examiner*—Aaron Weisstuch
*Attorney, Agent, or Firm*—Brumbaugh, Graves, Donohue & Raymond

[57] ABSTRACT

Solar cells are formed of (a) a transparent substrate; (b) a transparent electrode; (c) a first doped layer comprising amorphous silicon oxide, optionally including nitrogen, said first doped layer containing a dopant whereby the first doped layer is of a first conductivity type and has an optical gap of from 2.0 to 2.3 eV and a ratio of light conductivity to dark conductivity of 5 or less at 25° C.; (d) a layer of intrinsic amorphous silicon; (e) a second doped layer comprising amorphous silicon, said second doped layer containing a dopant whereby the second doped layer is of a second conductivity type different from the first conductivity type; and (f) a second electrode. The first doped layer may be of either n-type or p-type conductivity. The first doped layer can be formed over the transparent electrode by decomposing a gas mixture comprising $SiH_4$, an oxygen source gas selected from $N_2O$ or $CO_2$, and a dopant, in a hydrogen carrier at a substrate temperature of 150° to 250° C., the amount of hydrogen being from 10 to 50 times the amount of $SiH_4$, said first doped layer being of a first conductivity type. An interfacial layer of intermediate gap may also be included when the first doped layer is a p-type layer. Also described is a method for the formation of an amorphous silicon-oxide film to be utilized in making the thin-film solar cell.

32 Claims, 8 Drawing Sheets

THIN-FILM SOLAR CELL AND METHOD OF MANUFACTURING SAME

SPECIFICATION

This application is a continuation-in-part of U.S. patent application Ser. No. 08/077,824 filed Jun. 15, 1993, now abandoned, which in turn is a continuation-in-part of U.S. patent application Ser. No. 07/953,522 filed Sep. 29, 1992, now abandoned.

BACKGROUND OF THE INVENTION

The present invention relates to thin-film amorphous silicon solar cells and to a method for forming a silicon-oxide semiconductor film suitable for use as a window layer in an amorphous silicon (a-Si) solar cell.

Large area films of amorphous silicon (a-Si) as the main material can be readily made via a glow discharge decomposition of a silane-containing raw material gas or a photo-CVD process. The combination of large area and easy processing makes amorphous silicon a desirable candidate for use in low-cost solar cells. Such a solar cell generally employs a p-i-n junction construction as shown in FIG. 6. The solar cell of FIG. 6 is manufactured by laminating sequentially, on a glass substrate 1 a transparent electrode 2, a p-type a-Si layer 31, a p/i interface layer 4, an intrinsic a-Si layer 5, an n-type a-Si layer 6, and a metallic electrode 7. This solar cell generates electric power by light admitted through the glass substrate 1.

In this construction, photo-carriers that contribute to power generation are generated mainly at the intrinsic layer, while the p-type layer and the n-type layer are dead layers. Therefore, in a solar cell such as that of FIG. 6 in which light passes through the p-type layer to reach the intrinsic layer, it is important in order to increase the output of the device to raise the light transmissivity in the p-type layer so that as much light as possible can reach the intrinsic layer. To achieve this, it is effective to increase the optical gap, Eg, in the p-type layer and thereby decrease optical absorption loss. This can be achieved by adding carbon atoms to the p-type a-Si layer (Japanese laid-open application No. 56-64476), adding nitrogen atoms to the p-type a-Si layer (Japanese laid-open application No. 57-181176), adding oxygen atoms to the p-type a-Si layer (Japanese laid-open application No. 56-142680), or adding oxygen atoms and carbon atoms to the p-type a-Si layer (Japanese laid-open applications Nos. 58-196064, and 61-242085).

Increasing the optical gap of the p-type layer by adding a large quantity of C or N during the formation of the p-type layer does not produce a preferred device, however, because the process results in high levels of dangling bonds in the film, which in turn results in reduced electric conductivity. An a-Si solar cell is usually limited in that the electric conductivity of the film used in the p-type layer at 25° C. must be higher than $10^{-8}$ S/cm to suppress the reduction in the fill factor. When C or N are added to a p-type layer, this requirement can only be met when the optical gap is kept below 2 eV. Therefore, the resulting cell has a relatively large light absorption loss in the p-type layer at 1–2 mA/cm$^2$ when converted to a short circuit current density. Similar difficulties can be anticipated for the cells disclosed in Japanese laid-open application 61-242085, where an undoped a-Si:O:C:H film is reported to have electric conductivity ($\delta_d$) of about $10^{-12}$ to $10^{-13}$ S/cm in a region with an optical gap of 2.0 eV or higher when an AM1 (pseudo-solar light) is irradiated at 100 mW/cm$^2$, although the optical gap of the p-type layer when it is doped is not reported.

A recent report indicates that a micro-crystalline phase has successfully been included in an amorphous silicon carbide (a-SiC) film to which carbon atoms were added, by using the ECR-CVD process shown in Japanese laid-open application 64-51618 or the plasma CVD process described in the Technical Digest of the International PVSEC-3 (1987), p. 49. The inclusion of the Si micro-crystalline phase enables the production of film having increased light conductivity and better electrical characteristics.

Utilization of the Si micro-crystalline phase enables one to widen the optical gap without decreasing light conductivity. Therefore, this has been thought to be a promising method for improving the characteristics of the window layer of a solar cell. The commercial applications of this presently known method are limited, however, because the film forming conditions for micro-crystallization are narrow in scope, thus making it difficult to raise the deposition rate.

Based on the above, the present invention is intended to provide a thin-film solar cell with a higher efficiency using an a-Si-based film that has larger optical gaps as a window layer and a high electric conductivity preferably of 0.5 to $1 \times 10^{-6}$ S/cm.

Additionally, the present invention also provides a method for forming an a-Si based film which utilizes an amorphous silicon oxide including a silicon micro-crystallization phase, thereby enabling the production of a film with the desired characteristics, which can be produced over a broader range of industrial conditions than provided for by the above-referenced prior art.

SUMMARY OF THE INVENTION

In accordance with the invention, solar cells are formed of (a) a transparent substrate; (b) a transparent electrode; (c) a first doped layer comprising amorphous silicon oxide, optionally containing nitrogen, said first doped layer containing a dopant whereby the first doped layer is of a first conductivity type and having an optical gap of from 2.0 to 2.3 eV and a ratio of light conductivity to dark conductivity of 5 or less at 25° C.; (d) a layer of intrinsic amorphous silicon; (e) a second doped layer comprising amorphous silicon, said second doped layer containing a dopant whereby the second doped layer is of a second conductivity type different from the first conductivity type; and (f) a second electrode. The first doped layer may be of either n-type or p-type conductivity.

The first doped layer can be formed over the transparent electrode by decomposing a gas mixture comprising $SiH_4$, $CO_2$ or $N_2O$, and a dopant in a hydrogen carrier at a substrate temperature of 150° to 250° C., the amount of hydrogen being from 10 to 50 times the amount of $SiH_4$, said first doped layer being of a first conductivity type. An interfacial layer of intermediate gap may also be included when the first doped layer is a p-type layer.

The silicon-oxide semiconductor film is formed using decomposition of a raw material gas containing at least $SiH_4$, $CO_2$ and $H_2$, and having a $CO_2/(SiH_4+CO_2)$ flow rate ratio of 0.6 or lower. In this case, a glow discharge is generated in the raw material gas to decompose the gas mixture at a high-frequency power density of 40 mW/cm$^2$ or higher. The light absorption coefficient for light with wavelengths of 340 nm or longer in the obtained SiO semiconductor film is $10^6$ cm$^6$ cm$^{-1}$ or lower, and the light conductivity is $10^{-6}$ S/cm or higher. The p-type or n-type film obtained by mixing the raw material gas with a doping gas may be effectively used as a window layer in the solar cell.

Forming a window layer for a solar cell using a raw material gas containing $SiH_4$, $CO_2$ and $H_2$ is described in the above-referenced Japanese laid-open application number 61-242085; wherein the value of the gas flow rate ratio $CO_2/(SiH_4+CO_2)$ is 0.83, and the obtained a-Si film contains oxygen atoms and carbon atoms. In contrast, if $CO_2/(SiH_4+CO_2)$ is made 0.6 or lower as provided for herein, the carbon amount will be below the detection limit, especially in a film obtained by a glow discharge at a high-frequency power density of 40 $mW/cm^2$ or higher. The resultant SiO film has a high light-absorption coefficient at a light conductivity higher than $10^{-6}$ S/cm.

DETAILED DESCRIPTION OF THE INVENTION

Figure 1:
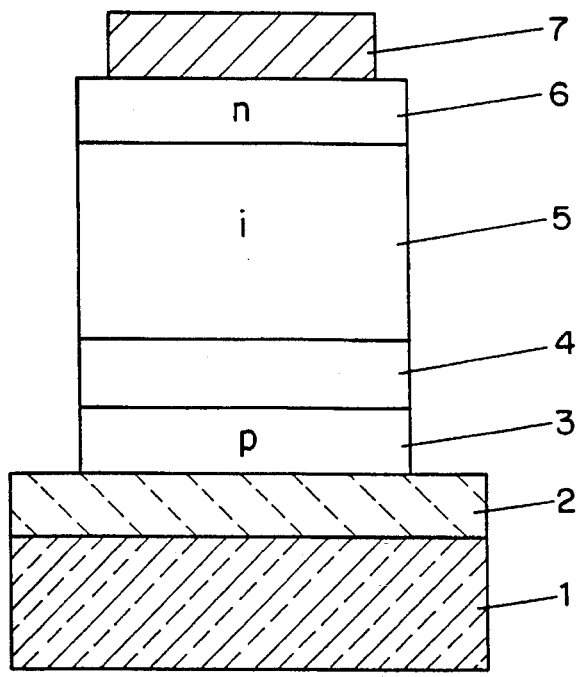
FIG. 1 is a cross section of a single cell of an a-Si solar cell according to one embodiment of the present invention.

One aspect of the present invention, as depicted in FIG. 1, provides a solar cell that has a p-i-n junction construction using an amorphous silicon film as its main material. The device can be formed such that either a p-type layer or an n-type layer is disposed on the light admittance side of the intrinsic layer. In accordance with the invention, this layer between the transparent substrate and the intrinsic layer is formed of amorphous silicon oxide, optionally containing nitrogen, of the general formula $a\text{-}Si_{(1-x)}O_xN_y$, wherein $0.05<x<0.40$ and $0<y<0.7$. Such a material has an optical gap of 2.0 eV to 2.3 eV, and a ratio of light conductivity to dark conductivity of 5 or lower at 25° C. In the case that the layer on the light admittance side of the intrinsic layer is a p-type layer, an interface layer, for example made of a-SiC or a-SiO, having an optical gap less than the p-type layer, e.g., as a result of containing an amount of dopant lower than that in the p-type layer, is advantageously interposed between the p-type layer and the intrinsic layer.

A layer having these properties can be formed by adding a gas containing an appropriate doping impurity to a gas mixture in which $SiH_4$ and an oxygen source gas selected from $N_2O$ or $CO_2$ are diluted by hydrogen in an amount 10 to 50 times the amount of $SiH_4$, and then by decomposing it at a substrate temperature of 150°–250° C. The gas mixture can be decomposed by glow discharge decomposition. In this process using $CO_2$ as the source gas, less than 0.5% carbon is taken into the film that has been formed and the film has the composition of $a\text{-}Si_{(1-x)}O_x$, wherein $0.10<x<0.40$. On the other hand, when $N_2O$ is the source gas, more significant amounts of nitrogen are incorporated resulting in a silicon oxynitride film when the composition $a\text{-}Si_{(1-x-y)}O_xN_y$ wherein $0.5<x<0.40$ and $0.03<y<0.07$.

Generally when a film is formed from $SiH_4$ and $O_2$, the $SiH_4$ reacts vigorously with $O_2$ in the gaseous phase, generating $SiO_2$ which is included in the film, making it very defective. In contrast, in the new method according to the invention $SiH_4$ does not react with $CO_2$ or $N_2O$ in the gaseous phase, no $SiO_2$ is generated, and a good film with few defects results. Furthermore, by means of suppressing the optical gap into a range from 2.0 eV to 2.3 eV and keeping the ratio of light conductivity, $\delta_{ph}$, to dark conductivity $\delta_d$, $\delta_{ph}/\delta_d$, equal to 5 or less, it is possible to obtain a thin-film solar cell with a p-i-n junction using as a window layer a p-type layer or an n-type layer with an optical gap of 2.0 eV or more and electric conductivity of $10^{-8}$ S/cm or more. Such a-SiO(N) with such film characteristics can be formed by adjusting the substrate temperature and the hydrogen dilution during the formation of the film.

The a-SiO film of the invention was formed by mixing $SiH_4$, $CO_2$ and $H_2$, and adding $B_2H_6$ or $PH_3$ as a doping gas to the material gas, and then varying the flow rate ratio for each gas under the following film forming conditions:

| | |
|---|---|
| $CO_2/(SiH_4 + CO_2)$ | 0 to 0.6 |
| $H_2/SiH_4$ | 160 to 320 |
| $B_2H_6/SiH_4$ or $PH_3/SiH_4$ | 0.08 |
| Substrate temperature | 150° C. |
| Pressure | 0.5 Torr |
| High-frequency power density | 50 $mW/cm^2$ |

Figure 2:
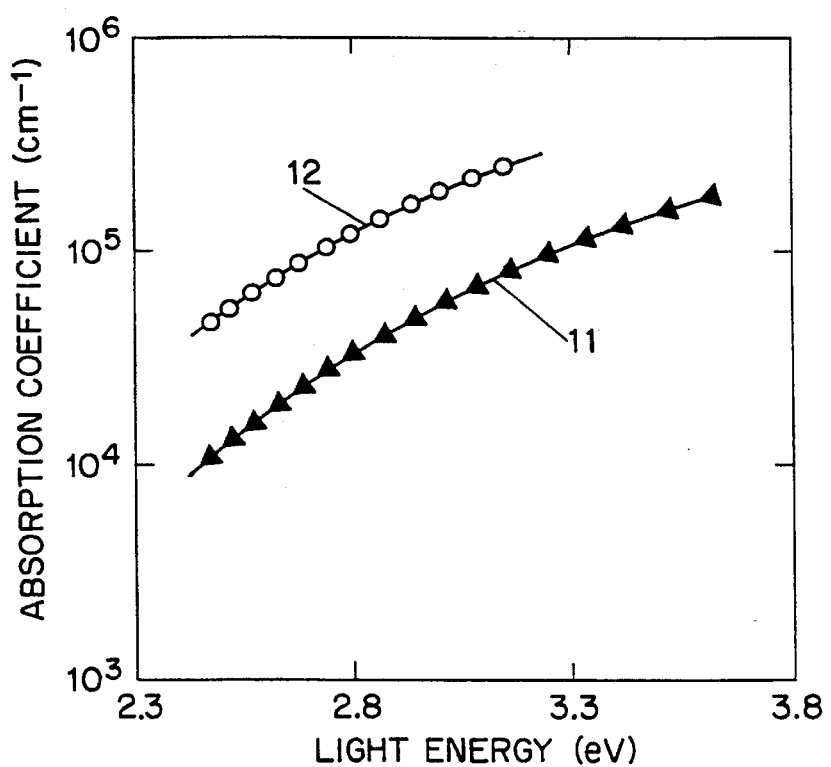
FIG. 2 is a graph showing the relationship between the absorption coefficient of a p-type SiO film formed according to an embodiment of the present invention and a conventional p-type a-SiO film.

FIG. 2 shows a graph which compares the absorption coefficient of a SiO film produced by the inventive methodology to that of a conventional p-type a-SiO film. It is observed that over a wide range of wavelengths, the absorption coefficient of an a-SiO film containing a micro-crystalline phase (line 11) is one-third the absorption coefficient of an a-SiO film which does not contain a micro-crystalline phase (line 12).

Figure 3:
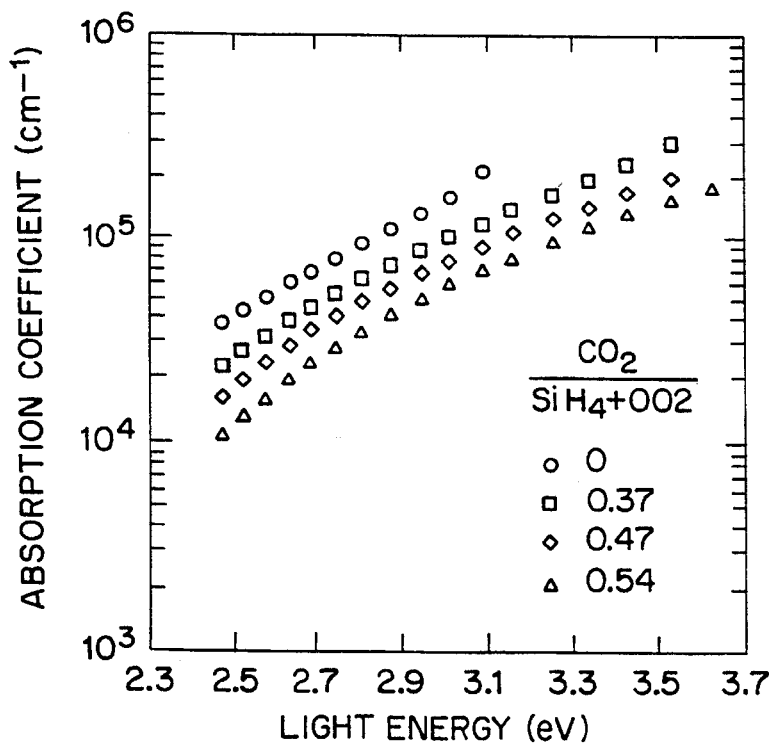
FIG. 3 is a graph showing the relationship between the absorption coefficient of a p-type SiO film formed according to an embodiment of the present invention using the $CO_2$ gas flow rate ratio during film formation.

FIG. 3 shows how the absorption coefficient in p-type films is altered by adding $B_2H_6$ as a doping gas on the gas flow rate ratio $CO_2/(SiH_4+CO_2)$. It was found that the absorption coefficient is $10^6$ $cm^{-1}$ or less, which decreases as the wavelength gets longer and as the $CO_2$ flow rate ratio increases.

Figure 4:
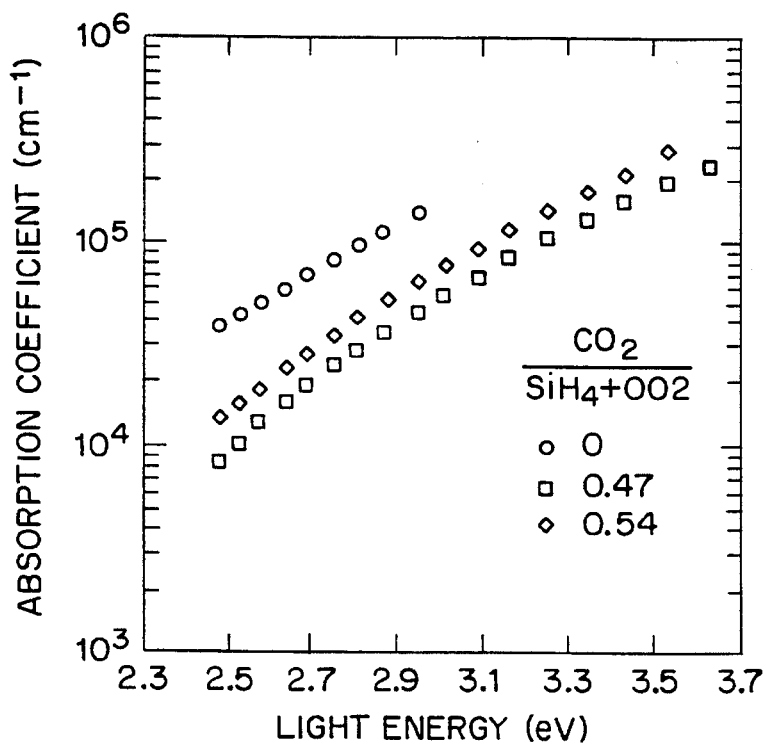
FIG. 4 is a graph showing the absorption coefficient of an n-type SiO film formed according to another embodiment of the present invention using the $CO_2$ gas flow rate ratio during film formation.

Similar to the trend with p-type films, FIG. 4 shows the effect of the addition of $PH_3$ as a doping gas on the absorption coefficient of n-type films. An ESCA analysis of the formed p-type and n-type films verified that oxygen levels increase directly in relation to the increase in the flow rate ratio of the $CO_2$ being mixed in. The oxygen amount was 25% to 40% by atomic weight, while the carbon amount was below the detectable limit of 1%.

Figure 5:
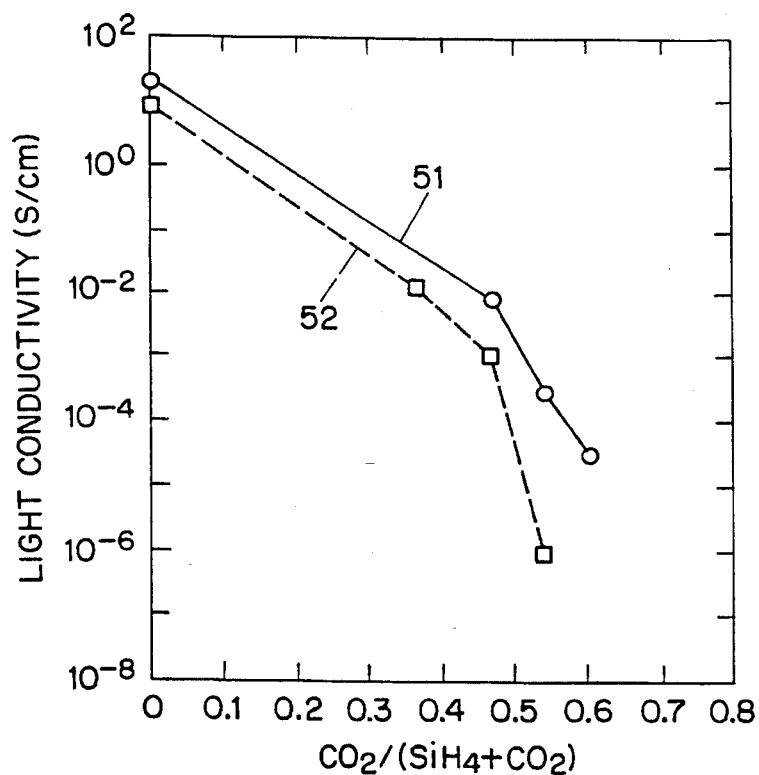
FIG. 5 is a graph showing how the $CO_2$ gas flow rate ratio affects the light conductivity of a p-type and an n-type SiO film formed according to an embodiment of the present invention.

FIG. 5 shows that the light conductivity level and Rph decline as the $CO_2$ flow rate increases. The n-type (line 51) obtained higher light conductivity levels than the p-type (line 52). To attain light conductivity levels higher than $10^{-6}$ S/cm, the flow rate ratio $CO_2/(SiH_4+CO)$ must be lower than 0.6

Measurement of Raman scattering on the SiO film formed according to the invention herein reveals that a peak exists at about 530 $cm^{-1}$. This indicates both that Si crystals are present in the Raman spectra and the coexistence of the Si micro-crystalline phase and the a-SiO phase.

Under the same conditions, films formed using $C_2H_2$ in place of $CO_2$ did not obtain a peak Raman spectra of 530 $cm^{-1}$, even though the carbon amount in the films that were produced was as low as 20% by atomic weight. This suggests that oxygen atoms are much better than carbon atoms in fostering the micro-crystallization of silicon. Thus, even if the absorption coefficient could be reduced by using wider gaps, the decrease in light conductivity of films formed using $C_2H_2$ makes them unsuitable as window layer material for a solar cell.

The invention also allows for the formation of a film having a low absorption coefficient due to the use of wider optical gap by oxygen atoms, and higher light conductivity due to the micro-crystallization phase. Therefore, the film can be utilized very effectively as the p-type or n-type window layer in an a-Si based solar cell.

Figure 6:
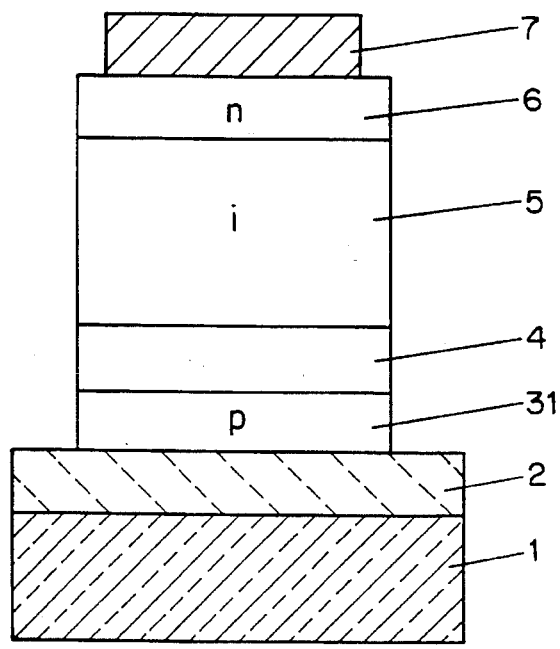
FIG. 6 is a cross section of a single cell of a conventional a-Si solar cell.

FIG. 1 shows a cross section of such an a-Si solar cell according to one embodiment of the present invention, with the parts common to those in FIG. 6 given the same numerals. This solar cell can be manufactured in the following manner. First, a film made of $SnO_2$ or the like is formed as a transparent electrode 2 on a glass substrate 1 to a thickness of between 5000 and 10000 Å. The substrate is mounted in a plasma CVD device, and the p-type a-SiO film 3 is formed to a thickness of 100–200 Å by a glow discharge decomposition process using $SiH_4$ (monosilane) and $CO_2$ as its main gas, $H_2$ as its diluting gas, and $B_2H_6$ as its doping gas. In this case, the $B_2H_6$ amount added is within a range of $B_2H_6/SiH_4$=0.2–1%, the substrate temperature during the formation of the film 140°–250° C., and the hydrogen dilution ($H_2/SiH_4$) is 10–50. Next, a p/i interface layer 4 of a-SiC is formed to a thickness of 50–200 Å using $SiH_4$ and $CH_4$ as its main gas, and $H_2$ as the diluting gas. This p/i interface layer does not include boron, and the film forming conditions are selected so that the optical gap will be a value between that of the p-type layer 3 and the intrinsic layer 5 which has an optical gap of 1.8–2.0 eV. The substrate temperature is then raised to 200°–250° C., and the intrinsic a-Si layer 5 is formed to a thickness of 2000–5000 Å using $SiH_4$ as the main gas, and $H_2$ as the diluting gas. Thereafter, the n-type a-Si layer 6 is formed thereupon to a thickness of 150–300 Å using $SiH_4$ as the main gas, $H_2$ as the diluting gas, and $PH_3$ as the doping gas. Finally, the metallic electrode 7 is formed by depositing Ag or Al, or via the sputtering method and patterning process.

Figure 7:
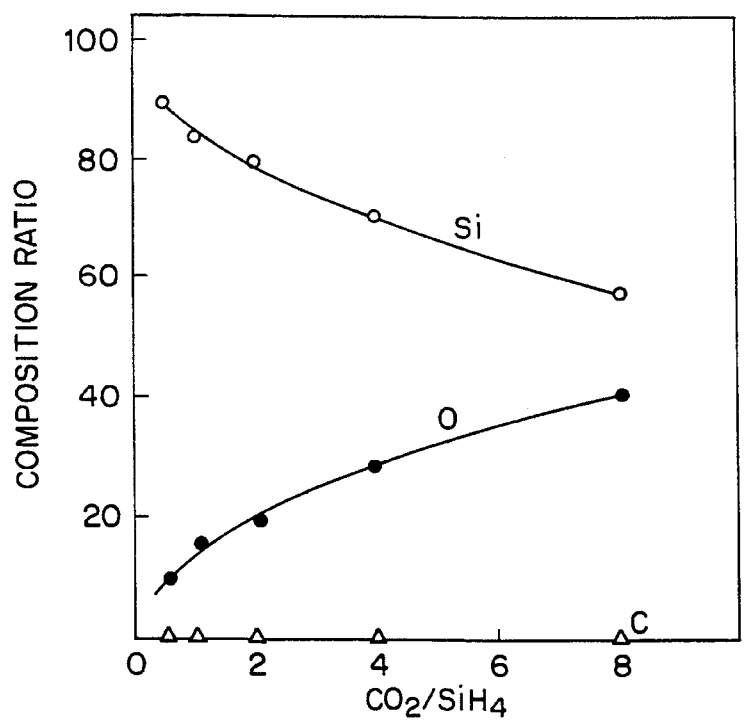
FIG. 7 is a graph showing the relationship between the gas flow ratio and the composition ratio in a-SiO film.

The film formed by using $SiH_4$ and $CO_2$ as the main gas, and $H_2$ as the diluting gas has a carbon concentration of 0.5% or less. This has been confirmed by analyzing the composition of the manufactured films using the X-ray photoelectron spectroscopic (XPS) method. FIG. 7 shows the compositional ratio of Si, O and C as derived from the gas flow ratio ($CO_2/SiH_4$) and the XPS method. All the films contained carbon below the detection limit (0.5%).

This same basic method can be employed to form devices with amorphous silicon oxynitride films by substituting $N_2O$ for $CO_2$ in the decomposition gas.

EXAMPLE 1

Figure 8:
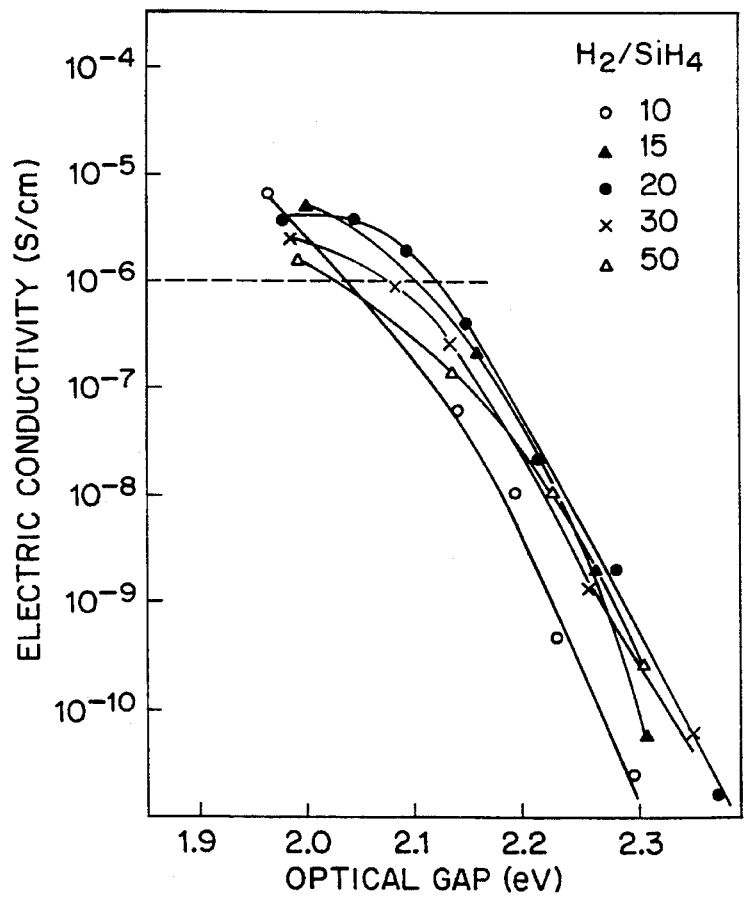
FIG. 8 is a graph showing the relationship between the film characteristics and hydrogen dilution in an a-SiO film.

The effects of the a-SiO film forming conditions on the film characteristics, and the relationship between electric conductivity and optical gap were investigated. First, the following experiment was carried out to investigate the effect of hydrogen dilution. The results are shown in FIG. 8.

| | |
|---|---|
| Gas used | $SiH_4$, $CO_2$, $H_2$, and $B_2H_6$ |
| Gas flow ratio | $H_2/SiH_4$ = 10, 15, 20, 30, 50 |
| | $B_2H_6/SiH_4$ = 0.006 |
| | $CO_2/SiH_4$ = 0.5–8 |
| Substrate temperature | 200° C. |
| Pressure | 0.5 Torr |

A film with an electric conductivity of $10^{-8}$ S/cm or more provides a high conversion efficiency when used in an a-Si solar cell as described earlier. To provide superior performance, materials in which the electric conductivity was $1\times10^{-6}$ S/cm are desired. Films having a hydrogen dilution of 10, 15, 20, 30, and 50 were found to have optical gaps of 2.04 eV, 2.11 eV, 2.12 eV, 2.09 eV, and 2.03 eV, respectively, with this high level of conductivity. In other words, it was found that an optical gap of more than 2.0 eV could be obtained in all of the films, while the most preferable film was the one with a hydrogen dilution of 20. Moreover, very good characteristics could be obtained when the hydrogen dilution was in a range between 15 and 30.

EXAMPLE 2

Figure 9:
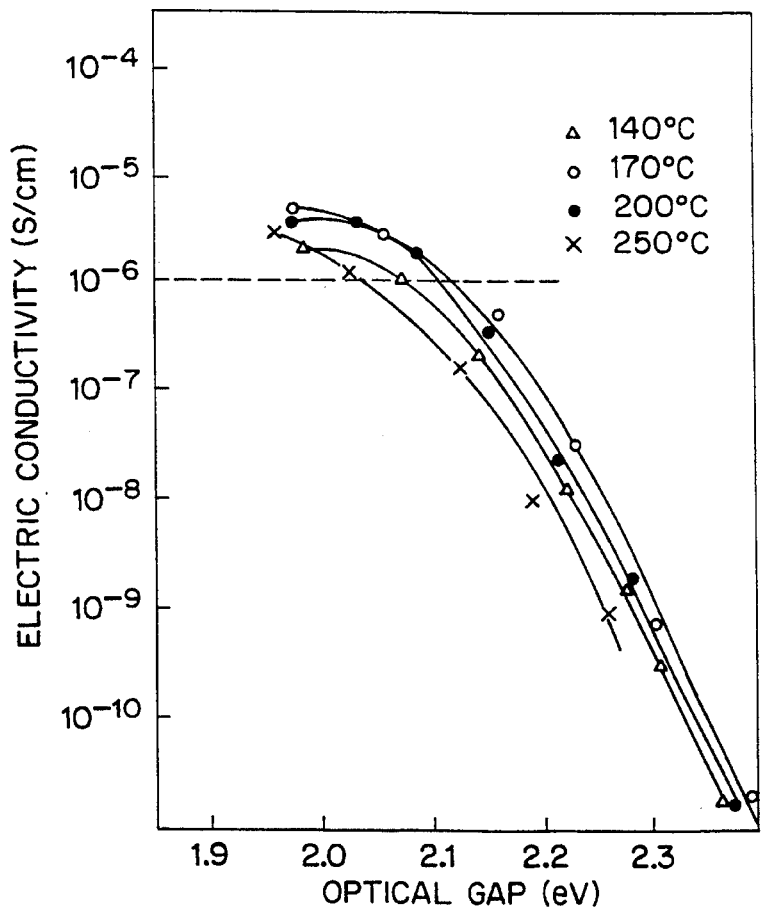
FIG. 9 is a graph showing the relationship between the film characteristics and the substrate temperature in an a-SiO film.

In order to investigate the effect of the substrate temperature, the following experiment was carried out. The results are shown in FIG. 9.

| | |
|---|---|
| Gas used | $SiH_4$, $CO_2$, $H_2$, and $B_2H_6$ |
| Gas flow ratio | $H_2/SiH_4$ = 20 |
| | $B_2H_6/SiH_4$ = 0.006 |
| | $CO_2/SiH_4$ = 0.5–8 |
| Substrate temperature | 140, 170, 200, 250° C. |
| Pressure | 0.5 Torr |

Optical gaps in which the electric conductivity is $1\times10^{-6}$ S/cm are 2.08 eV, 2.13 eV, 2.12 eV, and 2.05 eV, respectively, for films formed at substrate temperatures of 140° C., 170° C., 200° C., and 250° C. In other words, it was found that an optical gap of more than 2.0 eV could be obtained in all of the films, while the most preferable substrate temperature was 170° C. Moreover, very good characteristics could be obtained when the substrate temperature was in a range between 150° and 200° C. From FIGS. 8 and 9, it was noted that an electric conductivity of $10^{-8}$ S/cm or more could be obtained when the optical gap was 2.2 eV or less.

With respect to the hydrogen dilution and the substrate temperature as described above, the optimal conditions are obtained when the hydrogen dilution is 20 and the substrate temperature is 170° C., and the optical gap by which the electric conductivity is $1\times10^{-8}$ S/cm at this time is 2.13 eV. This optical gap is 0.1 eV or more higher than conventional a-SiC films or a-SiN films, with which extremely excellent characteristics can be obtained. It is also noted that, when the hydrogen dilution is within a range of 15 and 30 and the substrate temperature is between 150° C. and 200° C., a good optical gap of about 2.1 eV with electric conductivity of $1\times10^{-6}$ S/cm can be obtained.

Table 1 shows the light conductivity and the dark conductivity at 25° C. of the p-type a-SiO film formed under the above optimal film forming conditions, with hydrogen dilution at 20 fold and a substrate temperature of 170° C.

TABLE 1

| Optical gap (eV) | LIGHT CONDUCTIVITY $\sigma_{ph}$ (S/cm) | DARK CONDUCTIVITY $\sigma_d$ (S/cm) | $\sigma_{ph}/\sigma_d$ |
|---|---|---|---|
| 1.99 | $1.3 \times 10^{-5}$ | $5.1 \times 10^{-6}$ | 2.5 |
| 2.07 | $6.7 \times 10^{-5}$ | $2.8 \times 10^{-6}$ | 2.4 |
| 2.16 | $1.9 \times 10^{-6}$ | $7.1 \times 10^{-7}$ | 2.7 |
| 2.23 | $9.8 \times 10^{-8}$ | $2.8 \times 10^{-8}$ | 3.5 |
| 2.30 | $4.5 \times 10^{-8}$ | $7.9 \times 10^{-9}$ | 5.7 |
| 2.39 | $2.6 \times 10^{-10}$ | $2.9 \times 10^{-11}$ | 13.0 |

Table 1 shows that the $\sigma_{ph}/\sigma_d$ must be 5 or lower to obtain an electric conductivity of $10^{-8}$ S/cm or more.

EXAMPLE 3

The characteristics of single cells with the same construction as the one in FIG. 1 manufactured by applying p-type a-SiC films and p-type a-SiO films, and the characteristics of cells omitting the p/i interface layer 4 were compared. These single cells had the p-type layer, intrinsic layer, and n-type layer with thickness of 100 Å, 4000 Å, and 200 Å, respectively. The film-forming conditions for the p-type a-SiO film that were applied to the cells were as follows:

| Gas used | $SiH_4$, $CO_2$, $H_2$, and $B_2H_6$ |
|---|---|
| Gas flow ratio | $H_2/SiH_4 = 20$ |
|  | $B_2H_6/SiH_4 = 0.006$ |
|  | $CO_2/SiH_4 = 2.5$ |
| Substrate temperature | 170° C. |
| Pressure | 0.5 Torr |

The characteristics of the p-type a-SiO film thus obtained were as follows:
Optical gap ... 2.16 eV
Light conductivity ... $1.1\times10^{-6}$ S/cm
Electric conductivity ... $0.5\times10^{-6}$ S/cm Table 2 shows the results of the measurement of the conversion efficiency of the manufactured cells under irradiated light at AM 1.5 and 100 mW/cm².

TABLE 2

| p-type layer | a-SiC p/i interface layer | Open circuit voltage $V_{oc}$ (V) | Short circuit current $J_{sc}$ (mA/cm²) | Fill Factor FF | Conversion efficiency EFF (%) |
|---|---|---|---|---|---|
| a-SiC | Yes | 0.891 | 18.32 | 0.740 | 12.07 |
|  | No | 0.835 | 17.94 | 0.722 | 10.81 |
| a-SiO | Yes | 0.892 | 19.13 | 0.733 | 12.50 |
|  | No | 0.820 | 18.78 | 0.719 | 11.07 |

This table clearly indicates that applying an a-SiO film as a p-type layer results in a larger $J_{sc}$ than does applying an a-SiC film. It also results in a higher efficiency in both cases, with and without a p/i interface layer. These experiments revealed that the effect of inserting a p/i interface layer in the a-SiC film is equivalent in either case where the p-type layer consists of a-SiC or a-SiO. Incidentally, the role played by the p/i interface layer has been regarded as relaxing the lattice inconsistency created in materials of different kinds (a-SiC and a-Si, for example). Therefore, the p/i interface layer that has been used to date has always been of the same material that used for a p-type layer or intrinsic layer, and of a composition between that of the p-type layer and the intrinsic layer. Therefore, there has never been an attempt to insert an a-SiC p/i interface between the a-SiO p-type layer and the a-Si intrinsic layer as implemented in the present invention, while conventional theory has always held that this would only generate another lattice inconsistency. However, the conversion efficiency was actually improved in practice as a result of inserting a p/i interface layer, an astonishing fact that cannot be explained by conventional theory. However, this fact can be explained by using the following model. The defect in a p/i interface does not arise because of a lattice inconsistency, but rather because the boron in the p-type layer has been automatically doped in the intrinsic layer. Therefore, if an interface layer that does not contain boron and has a large optical gap is inserted into the p/i interface, automatic doping of boron into the intrinsic layer is suppressed, and the interface defects are reduced.

Figure 10:
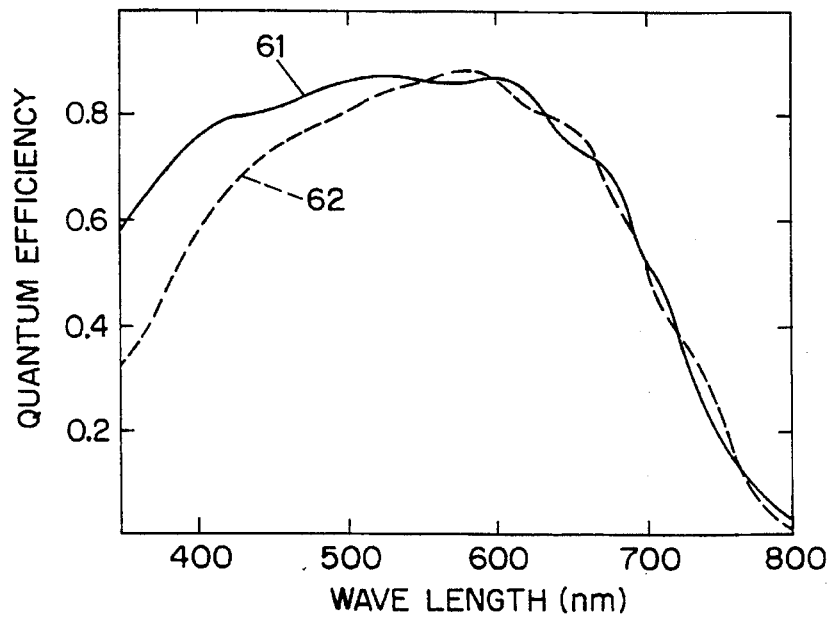
FIG. 10 is a graph showing the spectral sensitivity characteristics of a cell using an a-SiO film and a cell using an a-SiC film in the p-type layer.

FIG. 10 shows the spectral sensitivity characteristics of two kinds of cells, each inserted with a p/i interface layer of a-SiC. This figure shows that the cells formed with a p-type a-SiO film, indicated by the solid line 61 in FIG. 10, have better shortwave light sensitivity than cells that use the p-type a-SiC film indicated by the dotted line 62. These results demonstrate that applying a p-type a-SiO film to a cell can reduce light absorption loss more than by using a p-type a-SiC film, and can provide a higher conversion efficiency with an improved short-circuit current.

EXAMPLE 4

It is of course possible to use a-SiO in a p/i interface layer 4. The film-forming conditions for an a-SiO p/i interface layer applied to such cells are as follows:

| Gas used | $SiH_4$, $CO_2$, $H_2$ |
|---|---|
| Gas flow ratio | $H_2/SiH_4 = 20$ |
|  | $CO_2/SiH_4 = 0.25$ |
| Substrate temperature | 170° C. |
| Pressure | 0.5 Torr |

Figure 11:
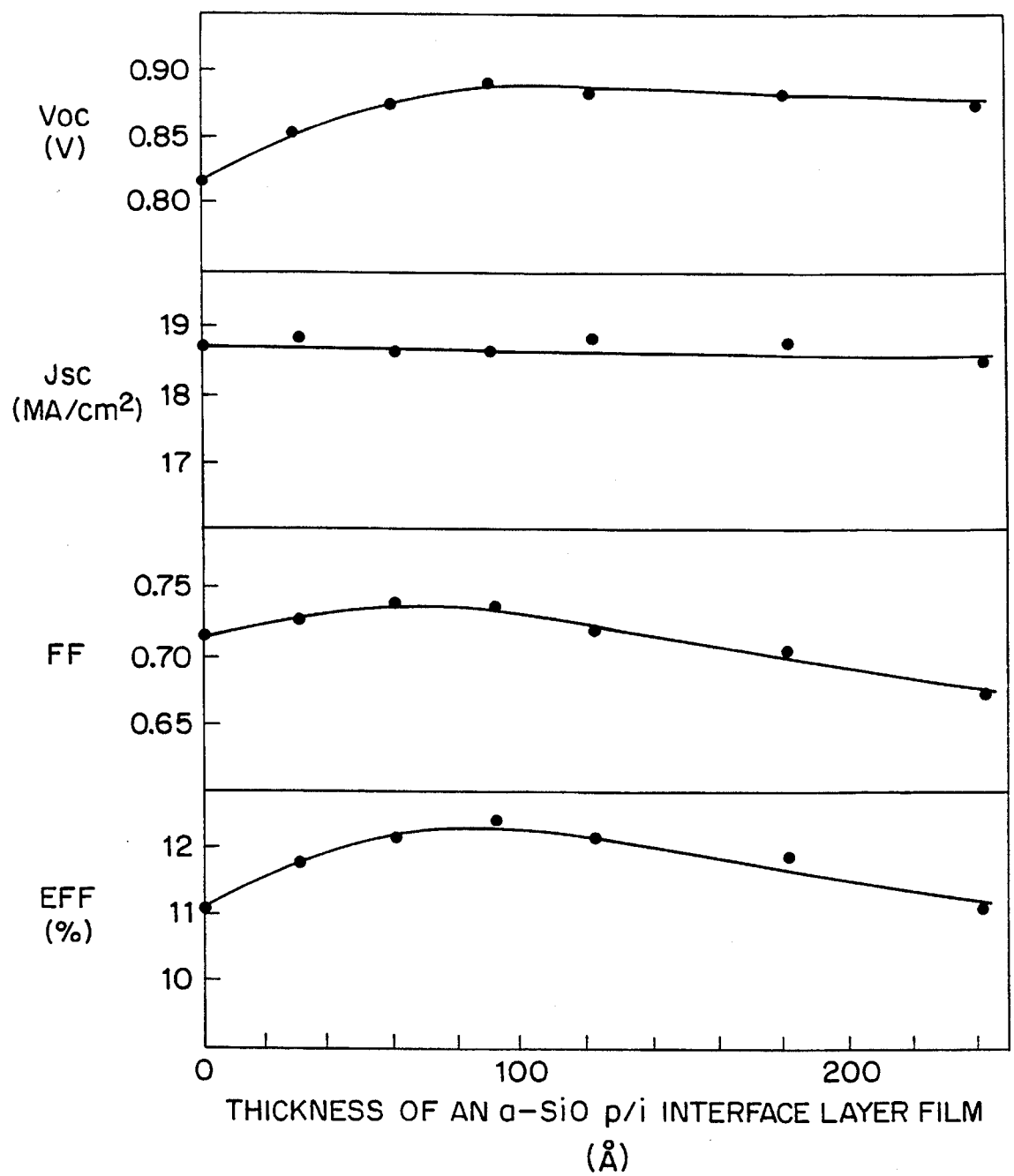
FIG. 11 is a graph showing the characteristics of a solar cell inserted with an a-SiO p/i interface layer, and the interface layer film thickness.

The characteristics of the film thus obtained are as follows:
Optical gap ... 2.00 eV
Light conductivity ... $1.7\times10^{-6}$ S/cm
Electric conductivity ... $1.2\times10^{-11}$ S/cm FIG. 11 shows the relationship between the characteristics of a cell having an a-SiO p/i interface layer 4, and the thickness of the interface layer film. As can be seen from the figure, the insertion of a p/i interface layer increases the open-circuit voltage and improves the conversion efficiency. The highest conversion efficiency of 12.5% has been achieved at $V_{oc}$=0.899 V, $J_{sc}$=18.81 mA/cm², and FF=0.740 when the film thickness of the p/i interface layer 4 is 90 Å. It is also known from the figure that the preferred film thickness in the p/i interface layer is 60–120 Å; however the thickness is effective for this purpose as long as it is within a range of 30 to 180 Å.

EXAMPLE 5

The above explanation applies to the case in which an a-SiO film is applied as a p-type layer; however, the a-SiO according to the present invention is effective even when applied as an n-type layer. As a result of manufacturing an n-type layer under the following film-forming conditions, good film characteristics have been obtained, including an optical gap of 2.1 eV with an electric conductivity of $1\times10^{-6}$ S/cm:

| Gas used | $SiH_4$, $CO_2$, $H_2$, $PH_3$ |
|---|---|
| Gas flow ratio | $H_2/SiH_4 = 20$ |
| | $PH_3/SiH_4 = 0.01$ |
| | $CO_2/SiH_4 = 0.5-8$ |
| Substrate temperature | 170° C. |
| Pressure | 0.5 Torr |

Figure 12:
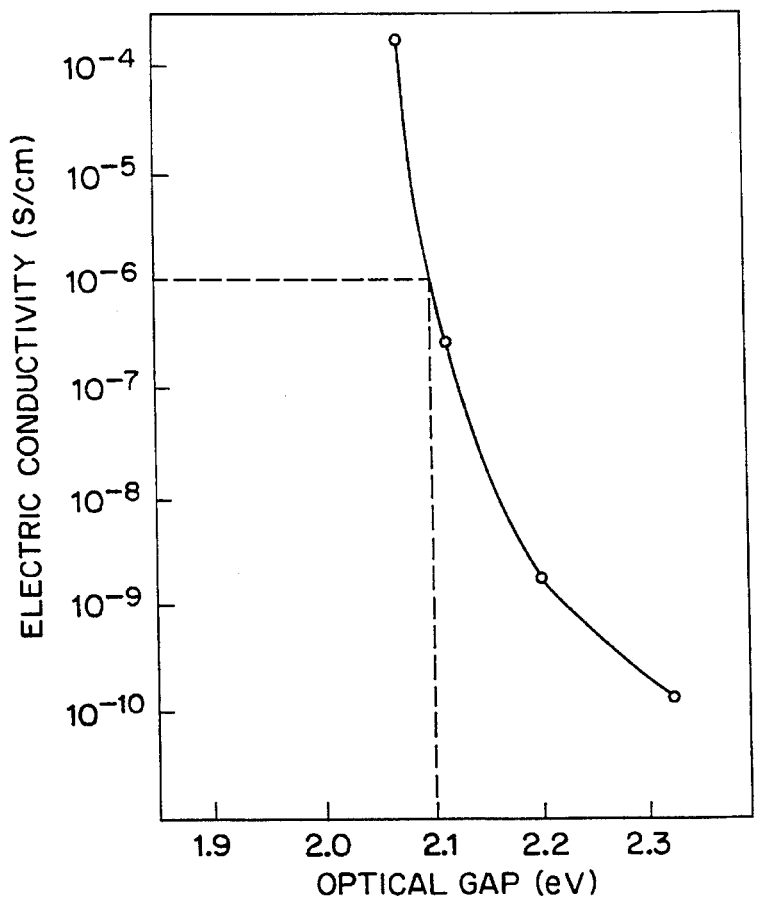
FIG. 12 is a graph showing the electric conductivity and the optical gap in an n-type a-SiO film.

The relationship of electric conductivity to optical gap of such an n-type a-SiO film is shown in FIG. 12.

According to the present invention, it is possible to form a film that has an optical gap of 2.1 eV or more and electric conductivity of $10^{-8}$ S/cm or more by making the optical gap between 2.0 and 2.2 eV, and $\delta_{ph}/\delta_d > 5$ by forming a p-type layer by decomposing a gas mixture of $SiH_4$, $CO_2$, and $H_2$, and keeping the substrate temperature and the hydrogen dilution during film formation at the proper values. This allows a reduction of the light absorption loss to a lower level than in the case of a p-type layer that has an optical gap of less than 2.0 eV. It also makes it possible to improve the short circuit-current density. Furthermore, together with the insertion of an a-SiC or a-SiO interface layer formed without adding boron into a p/i interface layer, the above construction provides a solar cell with higher conversion efficiency than that obtained when a conventional p-type layer is used.

EXAMPLE 6

Figure 13:
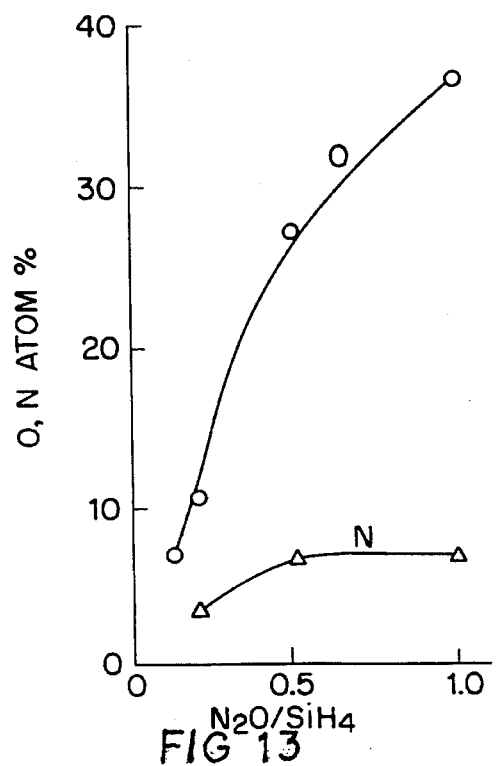
FIG. 13 shows the relationship between gas flow rate ratio and composition ratio in an a-Si:O:N film.

To determine the relationship between the gas flow ratio of $N_2O$ to $SiH_4$ to the oxygen and nitrogen content in the resulting film, several films were formed using $SiH_4$ and $N_2O$ as the material gases. The compositional ratios of Si, O and N were then determined by XPS. The results are shown in FIG. 13.

EXAMPLE 7

Films of amorphous silicon oxynitride were formed under the following conditions:

| Gas used | $SiH_4$, $N_2O$, $H_2$, $B_2H_6$ |
|---|---|
| Gas flow ratio | $H_2/SiH_4 = 20$ |
| | $B_2H_6/SiH_4 = 0.006$ |
| | $N_2O/SiH_4 = 0.125$ to 1 |
| Substrate temperature | 170° C. |
| Pressure | 0.5 Torr |

Figure 14:
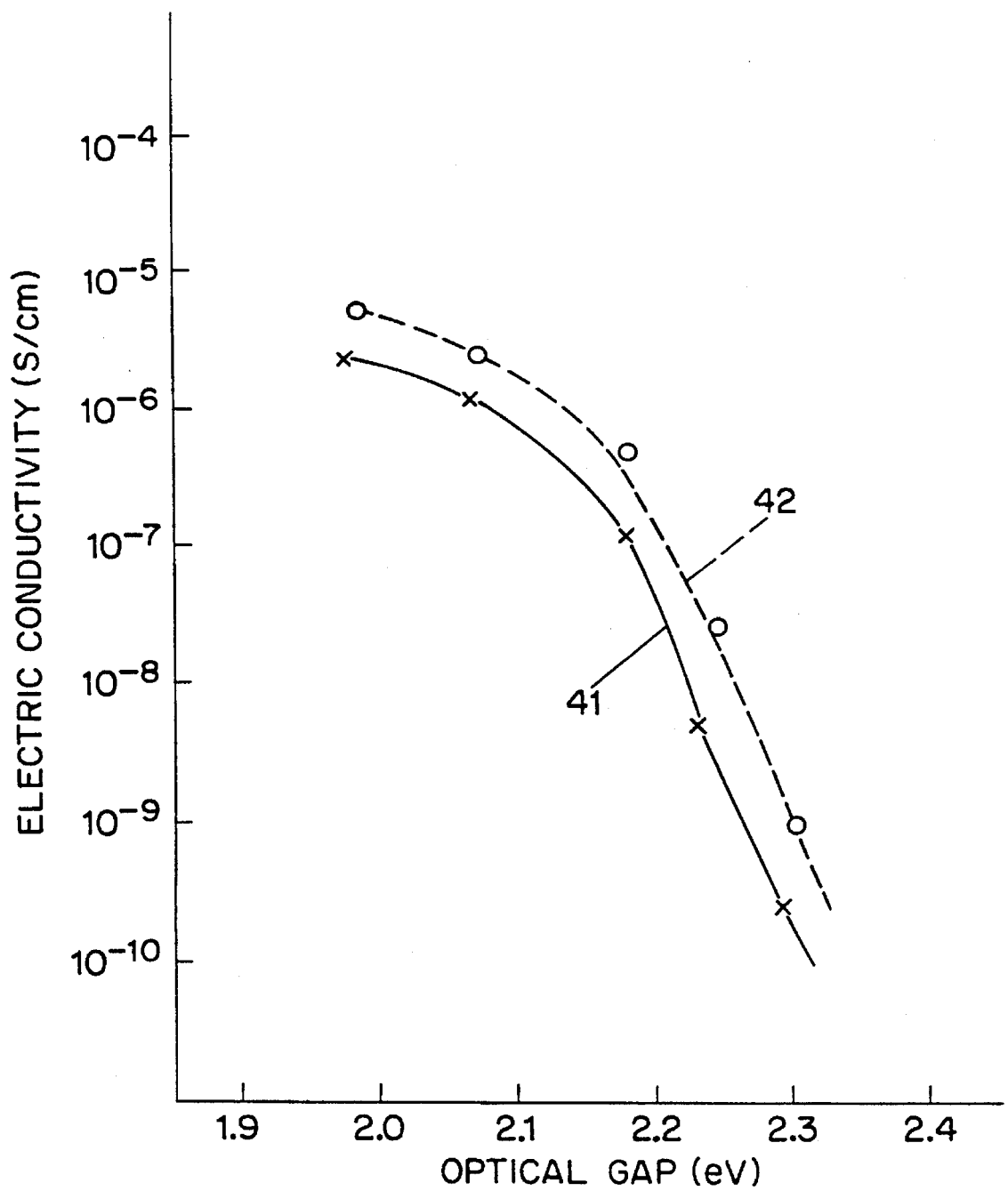
FIG. 14 shows the relationship between electrical conductivity and optical gap in an a-Si:O:N film.

The relationship between electrical conductivity and optical gap of these films is shown by the solid line 41 in FIG. 14. For comparison, dotted line 42 shows the same curve using $CO_2$ in place of $N_2O$.

Based on the results shown in FIG. 8, the film characteristics when $N_2O$ is used are nearly the same as those when $CO_2$ is used. An electric conductivity of $10^{-6}$ S/cm or higher is obtained at an optical gap of 2.08 eV, which is slightly inferior to an a-SiO film using $CO_2$, which is indicated by the dotted line (42). However, if compared with a conventional a-SiC film or a-SiN film, the value is higher by about 0.1 eV, thus exhibiting a superior characteristic.

Table 3 shows the light conductivity and dark conductivity at 25° C. of an a-Si:O:N film formed under the above conditions.

TABLE 3

| Optical gap (ev) | Light Conductivity $\sigma_{ph}$ (S/cm) | Dark Conductivity $\sigma_d$ (S/cm) | $\sigma_{ph}/\sigma_d$ |
|---|---|---|---|
| 1.98 | $6.02 \times 10^{-6}$ | $2.23 \times 10^{-6}$ | 2.5 |
| 2.07 | $2.69 \times 10^{-6}$ | $1.12 \times 10^{-6}$ | 2.4 |
| 2.18 | $5.67 \times 10^{-7}$ | $1.26 \times 10^{-7}$ | 4.5 |
| 2.23 | $3.11 \times 10^{-8}$ | $5.01 \times 10^{-9}$ | 6.2 |
| 2.29 | $4.52 \times 10^{-9}$ | $2.51 \times 10^{-10}$ | 18.0 |

Table 3 shows that an electric conductivity of $10^{-8}$ S/cm or higher can be obtained if the $\sigma_{ph}/\sigma_d$ is 5 or lower.

EXAMPLE 8

The characteristics of a single cell when an a-Si:O:N film was applied to the p-layer of the cell were compared with those of a single cell when an a-SiO film manufactured by using $CO_2$ was applied. In this case, the film thickness of the p-layer (3), the i-layer (5) and the n-layer (6) is 100 Å, 4000 Å and 200 Å, respectively. The film-forming conditions for the p-type a-Si:O:N film used in the cell are as follows:

| Gas used | $SiH_4$, $N_2O$, $H_2$, $B_2H_6$ |
|---|---|
| Gas flow ratio | $H_2/SiH_4 = 20$ |
| | $B_2H_6/SiH_4 = 0.006$ |
| | $N_2O/SiH_4 = 0.5$ |
| Substrate temperature | 170° C. |
| Pressure | 0.5 Torr |

The film-forming conditions for the a-SiO film were:

| Gas used | $SiH_4$, $CO_2$, $H_2$, $B_2H_6$ |
|---|---|
| Gas flow ratio | $H_2/SiH_4 = 20$ |
| | $B_2H_6/SiH_4 = 0.006$ |
| | $CO_2/SiH_4 = 2.52$ |
| Substrate temperature | 170° C. |
| Pressure | 0.5 Torr |

The characteristics of the resulting p-type a-Si:O:N film and a-SiO film are as follows:

a-Si:O:N film

Optical gap . . . 2.07 eV

Light conductivity . . . $2.69\times10^{-6}$ S/cm

Electric conductivity . . . $1.12\times10^{-6}$ S/cm a-SiO film

Optical gap . . . 2.16 eV

Light conductivity . . . $1.1\times10^{-6}$ S/cm

Electric conductivity . . . $0.5\times10^{-6}$ S/cm

As the p/i interface layer of these prototype cells, a p-layer comprises a-Si:O:N film and an a-SiO film in which the amount of oxygen doping for the cells using the a-Si:O:N film and a-SiO film, respectively, is smaller than that for the p-layer is used. Table 4 shows the results of measuring the conversion efficiency of the manufactured cells under irradiated light at AM 1.5 and 100 mW/cm². In this connection, Table 4 also shows the characteristics of the cells using a-SiC films in the p-layer and the p/i interface for comparison.

TABLE 4

| P-layer | Open Voltage $V_{oc}$ (V) | Short Circuit Current $J_{sc}$ (mA/cm$^2$) | Fill Factor FF | Conversion Efficiency EFF (%) |
|---|---|---|---|---|
| a-Si:O:N | 0.891 | 18.91 | 0.730 | 12.30 |
| a-SiO | 0.891 | 19.13 | 0.733 | 12.50 |
| a-SiC | 0.891 | 18.32 | 0.740 | 12.07 |

This table indicates that cells using a-Si:O:N films in the p-layer and the p/i interface layer have a larger JSC and higher efficiency than those using a-SiC films in the p-layer and p/i interface layer. The table also shows that, although the former cells are slightly inferior in terms of JSC and efficiency to those using a-SiO films in the p-layer and p/i interface layer (relative to how small the optical gap is) cells with an identically high performance can be obtained.

We claim:

1. A thin-film solar cell comprising, in sequence:
   (a) a transparent substrate;
   (b) a transparent electrode;
   (c) a first doped layer comprising amorphous silicon oxide of the general formula $Si_{(1-x-y)}O_xN_y$, wherein $0.05<x<0.40$ and $0\pm y<0.07$, said first doped layer containing a dopant whereby the first doped layer is of a first conductivity type and having an optical gap of from 2.0 to 2.3 eV and a ratio of light conductivity to dark conductivity of 5 or less at 25° C. and wherein the amorphous silicon oxide contains a micro-crystalline phase of silicon;
   (d) a layer of intrinsic amorphous silicon;
   (e) a second doped layer comprising amorphous silicon, said second doped layer containing a dopant whereby the second doped layer is of a second conductivity type different from the first conductivity type; and
   (f) a second electrode.

2. The thin-film solar cell according to claim 1, wherein the first doped layer of n-type conductivity.

3. The thin-film solar cell of claim 1, wherein the first conductivity type is p-type or n-type, and wherein the first doped layer comprises an amorphous silicon-oxide film which is used as a window layer in the solar cell.

4. The thin-film solar cell of claim 1, wherein the first conductivity type is p-type or n-type, and wherein the first doped layer comprises an amorphous silicon-oxide film which has an extinction coefficient less than or equal to $10^6$ cm$^1$ for incident light having a wavelength greater than or equal to 340 nm.

5. The thin-film solar cell of claim 1, wherein the first conductivity type is p-type or n-type, and wherein the first doped layer comprises an amorphous silicon-oxide film which has a light conductivity of $10^{-6}$ S/cm or higher.

6. The thin-film solar cell according to claim 1, wherein the silicon oxide has the formula $Si_{(1-x)}O_x$, wherein $0.10<x<0.40$.

7. The thin-film solar cell according to claim 1, wherein the silicon oxide has the formula $Si_{(1-x-y)}O_xN_y$, wherein $0.05<x<0.40$ and $0.03<y<0.07$.

8. A method of making an amorphous silicon-oxide film containing a micro-crystalline phase of silicon for a thin-film solar cell comprising forming said film by decomposing by means of a glow discharge plasma, a raw material gas comprising $SiH_4$, $CO_2$ and $H_2$, said gas having a $CO_2/(SiH_4+CO_2)$ flow rate ratio of 0.6 or less.

9. The method of claim 8 further comprising adding a doping gas to the raw material gas, said doping gas comprising $B_2H_6$ or $PH_3$.

10. The method of claim 9, wherein $B_2H_6$ is added at a $B_2H_6/SiH_4$ flow rate ratio of 0.08.

11. The method of claim 9, wherein $PH_3$ is added at a $PH_3/SiH_4$ flow rate ratio of 0.08.

12. The method of claim 8, further comprising generating glow discharge in the raw material gas at a high frequency power density of 40 mW/cm$^2$ or higher.

13. The method of claim 8, wherein $H_2$ is added at a $H_2/SiH_4$ flow rate ratio of 160 to 320.

14. The method of claim 8, wherein the film is formed at a pressure of 0.5 Torr.

15. A thin-film solar cell comprising, in sequence:
   (a) a transparent substrate;
   (b) a transparent electrode;
   (c) a first doped layer comprising amorphous silicon oxide of the general formula $Si_{(1-x-y)}O_xN_y$, wherein $0.05<x<0.40$ and $0\pm y<0.07$, said first doped layer containing a dopant whereby the first doped layer is of p-type conductivity, and has an optical gap of from 2.0 to 2.3 eV and a ratio of light conductivity to dark conductivity of 5 or less at 25° C.;
   (d) an interfacial layer;
   (e) a layer of intrinsic amorphous silicon;
   (f) a second doped layer comprising amorphous silicon, said second doped layer containing a dopant whereby the second doped layer is of a second conductivity type different from the first conductivity type; and
   (g) a second electrode.

16. A thin-film solar cell comprising, in sequence:
   (a) a transparent substrate;
   (b) a transparent electrode;
   (c) a first doped layer comprising amorphous silicon oxide of the general formula $Si_{(1-x-y)}O_xN_y$, wherein $0.05<x<0.40$ and $0\pm y<0.07$, said first doped layer containing a dopant whereby the first doped layer is of p-type conductivity and has an optical gap of from 2.0 to 2.3 eV and a ratio of light conductivity to dark conductivity of 5 or less at 25° C.;
   (d) an interfacial layer, wherein the interfacial layer comprises amorphous silicon carbide and has an optical gap less than the optical gap of the first doped layer;
   (e) a layer of intrinsic amorphous silicon;
   (f) a second doped layer comprising amorphous silicon, said second doped layer containing a dopant whereby the second doped layer is of a second conductivity type different from the first conductivity type; and
   (g) a second electrode.

17. A thin-film solar cell comprising, in sequence:
   (a) a transparent substrate;
   (b) a transparent electrode;
   (c) a first doped layer comprising amorphous silicon oxide of the general formula $Si_{(1-x-y)}O_xN_y$, wherein $0.05<x<0.40$ and $0\pm y<0.07$, said first doped layer containing a dopant whereby the first doped layer is of p-type conductivity and has an optical gap of from 2.0 to 2.3 eV and a ratio of light conductivity to dark conductivity of 5 or less at 25° C.;
   (d) an interfacial layer, wherein the interfacial layer comprises amorphous silicon oxide and has an optical gap less than the optical gap of the first doped layer;
   (e) a layer of intrinsic amorphous silicon;
   (f) a second doped layer comprising amorphous silicon, said second doped layer containing a dopant whereby the second doped layer is of a second conductivity type different from the first conductivity type; and (g) a second electrode.

18. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, an oxygen source gas selected from $N_2O$ and $CO_2$, and a dopant in a hydrogen carrier gas at a substrate temperature of 150° to 250° C., the amount of hydrogen being from 10 to 50 times the amount of $SiH_4$, said first doped layer being of a first conductivity type, wherein the first doped layer comprises a micro-crystalline phase of silicon;

(c) forming an intrinsic amorphous silicon layer over the first doped layer;

(d) forming a second doped layer of amorphous silicon having a conductivity type different from the first conductivity type over the intrinsic amorphous silicon layer; and (e) forming an electrode over the second doped layer.

19. The method according to claim 18, wherein the dopant in the first doped layer is selected such that the first doped layer is of p-type conductivity.

20. The method according to claim 18, wherein the oxygen source gas is $CO_2$.

21. The method according to claim 18, wherein the oxygen source gas is $N_2O$.

22. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, an oxygen source gas selected from $N_2O$ and $CO_2$, and a dopant in a hydrogen carrier gas at a substrate temperature of 150° to 25° C., the amount of hydrogen being from 10 to 50 times the amount of $SiH_4$, said first doped layer being of p-type conductivity;

(c) forming an interfacial layer over said first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

23. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, an oxygen source gas selected from $N_2O$ and $CO_2$, a dopant in a hydrogen carrier gas at a substrate temperature of 150° to 250° C., the amount of hydrogen being from 10 to 50 times the amount of $SiH_4$, said first doped layer being of p-type conductivity;

(c) forming an interfacial layer over said first dope layer, wherein the interfacial layer comprises amorphous silicon carbide and has an optical gap less than the optical gap of the first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

24. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, an oxygen source gas selected from $N_2O$ and $CO_2$, and a dopant in a hydrogen carrier at a substrate temperature of 150° to 250° C., the amount of hydrogen being from 10 to 50 times the amount of $SiH_4$, said first doped layer being of p-type conductivity;

(c) forming an interfacial layer over said first doped layer, wherein the interfacial layer comprises amorphous silicon oxide and has an optical gap less than the optical gap of the first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

25. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $CO_2$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

26. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $CO_2$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer, wherein the interfacial layer comprises amorphous silicon carbide and has an optical gap less than the optical gap of the first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

27. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $CO_2$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer, wherein the interfacial layer comprises amorphous silicon oxide and has an optical gap less than the optical gap of the first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

28. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $N_2O$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

29. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $N_2O$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer, wherein the interfacial layer comprises amorphous silicon carbide and has an optical gap less than the optical gap of the first doped layer;

(d) forming an intrinsic amorphous silicon layer over the interfacial doped layer;

(e) forming a second doped layer of amorphous silicon having a conductivity type different from the first conductivity type over the intrinsic amorphous silicon layer; and (f) forming an electrode over the second doped layer.

30. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, $N_2O$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer, wherein the interfacial layer is amorphous silicon oxide and has an optical gap less than the optical gap of the first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

31. A thin-film solar cell comprising, in sequence:

(a) a transparent substrate;

(b) a transparent electrode;

(c) a first doped layer comprising amorphous silicon-oxide of the general formula $Si_{(1-x-y)}O_xN_y$, wherein $0.05<x<0.40$ and $0\pm y<0.07$, said first doped layer containing a dopant whereby the first doped layer is of a first conductivity type and having an optical gap of from 2.0 to 2.3 eV and a ratio of light conductivity to dark conductivity of 5 or less at 25° C., and wherein the amorphous silicon oxide contains a micro-crystalline phase of silicon;

(d) an interfacial layer;

(e) a layer of intrinsic amorphous silicon;

(f) a second doped layer comprising amorphous silicon, said second layer containing a dopant whereby the second doped layer is of a second conductivity type different from the first conductivity type; and (g) a second electrode.

32. A method of making a thin-film solar cell comprising the sequential steps of:

(a) forming a transparent electrode on a transparent substrate;

(b) forming a first doped layer over the transparent electrode by decomposing by means of a glow discharge plasma, a gas mixture comprising $SiH_4$, an oxygen source gas selected from $N_2O$ and $CO_2$, and a dopant in a hydrogen carrier gas at a substrate temperature of 150° to 250° C., the amount of hydrogen being from 10 to 50 times the amount of $SiH_4$, said first doped layer being of a first conductivity type;

(c) forming an interfacial layer over said first doped layer;

(d) forming an intrinsic amorphous silicon layer over the interfacial layer;

(e) forming a second doped layer of amorphous silicon having a conductivity type different from the first conductivity type over the intrinsic amorphous silicon layer; and (f) forming an electrode over the second doped layer.

\* \* \* \* \*

UNITED STATES PATENT AND TRADEMARK OFFICE
CERTIFICATE OF CORRECTION

PATENT NO. : 5,507,881
DATED : April 16, 1996
INVENTOR(S) : Sichanugrist et al.

It is certified that error appears in the above-indentified patent and that said Letters Patent is hereby corrected as shown below:

Column 2, line 66, "$cm^6\ cm^{-1}$" should read --$cm^{-1}$--;

Column 10, line 12, "2.5" should read --2.7--;

Column 11, line 24, "$0 \pm y < 0.07$" should read --$0 \leq y < 0.07$--;

Column 11, line 47, "$cm^1$" should read --$cm^{-1}$--;

Column 12, line 18, "$0 \pm y < 0.07$" should read --$0 \leq y < 0.07$--;

Column 12, line 36, "$0 \pm y < 0.07$" should read --$0 \leq y < 0.07$--;

Column 12, line 56, "$0 \pm y < 0.07$" should read --$0 \leq y < 0.07$--;

Column 13, line 41, "25° C." should read --250° C,---

Column 13, line 61, "$CO_2$, a" should read $CO_2$, and a--;

Column 13, line 66, "dope" should read --doped--;

Column 14, line 18, "carrier" should read --carrier gas--;

Column 15, line 67, "doped layer" should read --layer--;

UNITED STATES PATENT AND TRADEMARK OFFICE
CERTIFICATE OF CORRECTION

PATENT NO. : 5,507,881

DATED : April 16, 1996

INVENTOR(S) : Sichanugrist et al.

It is certified that error appears in the above-indentified patent and that said Letters Patent is hereby corrected as shown below:

Column 16, line 32, "$0\pm y<0.07$" should read --$0\leq y<0.07$--.

Signed and Sealed this

First Day of October, 1996

BRUCE LEHMAN

*Attest:*

*Attesting Officer*  *Commissioner of Patents and Trademarks*